United States Patent  
Weng

(10) Patent No.: US 7,041,565 B2
(45) Date of Patent: May 9, 2006

(54) METHOD FOR FABRICATING A CAPACITOR IN A SEMICONDUCTOR DEVICE

(75) Inventor: Wu-An Weng, Hsin-Chu (TW)

(73) Assignee: Macronix International Co., Ltd., Hsinchu (TW)

( * ) Notice: Subject to any disclaimer, the term of this patent is extended or adjusted under 35 U.S.C. 154(b) by 55 days.

(21) Appl. No.: 10/873,142

(22) Filed: Jun. 23, 2004

(65) Prior Publication Data
US 2005/0287761 A1 Dec. 29, 2005

(51) Int. Cl.
H01L 21/20 (2006.01)

(52) U.S. Cl. .............. 438/381; 438/386; 438/329; 438/239

(58) Field of Classification Search .............. None
See application file for complete search history.

(56) References Cited

U.S. PATENT DOCUMENTS

| 5,392,189 A * | 2/1995 | Fazan et al. ............ 361/305 |
| 6,214,667 B1 | 4/2001 | Ding et al. |
| 6,285,053 B1 * | 9/2001 | Park .................... 257/306 |
| 6,383,863 B1 * | 5/2002 | Chiang et al. ........... 438/241 |
| 6,872,622 B1 * | 3/2005 | Tu ....................... 438/253 |

* cited by examiner

*Primary Examiner*—Luan Thai
(74) *Attorney, Agent, or Firm*—Akin Gump Strauss Hauer & Feld, LLP

(57) ABSTRACT

A method for fabricating a capacitor in a semiconductor device that includes providing a semiconductor substrate, forming at least one shallow trench isolation structure in the semiconductor substrate, forming a tunnel oxide layer over the semiconductor substrate, depositing a first polysilicon layer over the tunnel oxide layer, depositing a nitride layer over the first polysilicon layer, depositing a first photoresist over the nitride layer, patterning and defining the first photoresist layer to expose at least a portion of the nitride layer, etching the exposed portion of the nitride layer and the first polysilicon layer underneath the exposed portion of the nitride layer to expose at least a portion of the tunnel oxide layer, removing the patterned and defined photoresist layer, forming a second oxide layer over at least the exposed portion of the tunnel oxide layer, providing a second photoresist layer over the second oxide layer, providing an etchback process to remove a portion of the second photoresist layer and a potion of the nitride layer, removing the residual second photoresist layer and the residual nitride layer to expose at least a portion of the first polysilicon layer, and forming and patterning a second polysilicon layer over at least the exposed portion of the first polysilicon layer.

11 Claims, 3 Drawing Sheets

METHOD FOR FABRICATING A CAPACITOR IN A SEMICONDUCTOR DEVICE

FIELD OF THE INVENTION

This invention relates a method of fabricating a semiconductor device, and more particularly, to a method of fabricating a capacitor in a semiconductor device.

BACKGROUND OF THE INVENTION

Capacitors are formed in semiconductor devices for a variety of purposes. The characteristics of a capacitor in a semiconductor device require the two conductive plates, usually comprised of polysilicon, to have certain depths. However, the non-conformity nature of the polysilicon prevents the plates from being formed in a single step. Therefore, conventional methods form a portion of the plates, add a layer of dielectric material, and form the remaining portion of the capacitor plates. The layer of dielectric material is usually deposited with a high-density plasma ("HDP") deposition process. A chemical-mechanical polishing ("CMP") step then follows to planarized the layer of dielectric material.

However, the CMP process often removes a portion of the dielectric layer. The unpredictability in the thickness of the dielectric layer often leads to capacitors not having the designed capacitances. In addition, the CMP process often results in non-uniformity and scratched surfaces of the dielectric layer, which will similarly affect the characteristics of the capacitors.

SUMMARY OF THE INVENTION

In accordance with the invention, there is provided a method of fabricating a semiconductor device that includes providing a semiconductor substrate, forming a plurality of shallow trench isolation structures in the semiconductor substrate, forming a first oxide layer over the semiconductor substrate and the plurality of shallow trench isolation structures, depositing a first polysilicon layer over the first oxide layer, depositing a nitride layer over the first polysilicon layer, masking at least two portions of the nitride layer between two of the plurality of shallow trench isolation structures, etching unmasked portions of the nitride layer and portions of the first polysilicon layer underneath the exposed portions of the nitride layer to expose at least a portion of the first oxide layer, forming a second oxide layer of a specified thickness over the exposed portion of the first oxide layer, providing a sacrificial layer over the second oxide layer, etching to remove a portion of the sacrificial layer and a portion of the nitride layer, and removing the residual sacrificial layer and the residual nitride layer to expose at least two separate portions of the first polysilicon layer.

Also in accordance with the invention, there is provided a method for fabricating a capacitor in a semiconductor device that includes providing a semiconductor substrate, forming at least one shallow trench isolation structure in the semiconductor substrate, forming a tunnel oxide layer over the semiconductor substrate, depositing a first polysilicon layer over the tunnel oxide layer, depositing a nitride layer over the first polysilicon layer, depositing a first photoresist over the nitride layer, patterning and defining the first photoresist layer to expose at least a portion of the nitride layer, etching the exposed portion of the nitride layer and the first polysilicon layer underneath the exposed portion of the nitride layer to expose at least a portion of the tunnel oxide layer, removing the patterned and defined photoresist layer, forming a second oxide layer over at least the exposed portion of the tunnel oxide layer, providing a second photoresist layer over the second oxide layer, providing an etchback process to remove a portion of the second photoresist layer and a potion of the nitride layer, removing the residual second photoresist layer and the residual nitride layer to expose at least a portion of the first polysilicon layer, and forming and patterning a second polysilicon layer over at least the exposed portion of the first polysilicon layer.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate an embodiment of the invention and together with the description, serve to explain the principles of the invention.

DESCRIPTION OF THE EMBODIMENTS

Reference will now be made in detail to the present embodiment of the invention, an example of which is illustrated in the accompanying drawings. Wherever possible, the same reference numbers will be used throughout the drawings to refer to the same or like parts.

The present invention provides a method of fabricating a capacitor in a semiconductor device that avoids the non-uniform polishing, scratching, and thickness control problems attributable to the prior art chemical-mechanical polishing ("CMP") process. One such semiconductor device manufactured using the present invention is a flash memory. The present invention provides a sacrificial layer and etchback process to precisely control the thickness of an oxide layer. Furthermore, production cost is minimized because both the sacrificial layer and etchback process are commonly used in semiconductor manufacturing.

Figure 1:
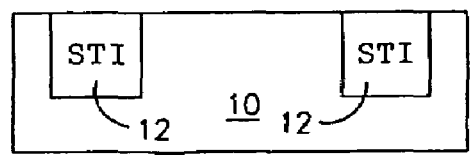
FIGS. 1–7 are cross-sectional views of the semiconductor manufacturing steps consistent with the present invention.

FIGS. 1–7 are cross-sectional views of the semiconductor manufacturing steps consistent with one embodiment of the present invention. One skilled in the art will appreciate that the present invention may be used in any semiconductor process to form a capacitor. As shown in FIG. 1, the method of the present invention provides a substrate 10 with a plurality of shallow trench isolation ("STI") structures 12. The STI structures 12 define an active area by electrically isolating the active area from adjacent areas of the substrate 10 and increase the tunneling efficiency by minimizing the tunneling window area. The STI structures 12 may be formed by any conventional process steps. For example, a shallow trench may be first formed in the substrate and then filled with a dielectric material such as silicon nitride or silicon dioxide. A planarization step such as CMP or an etchback process may follow to obtain a substantially planar substrate surface.

Figure 2:
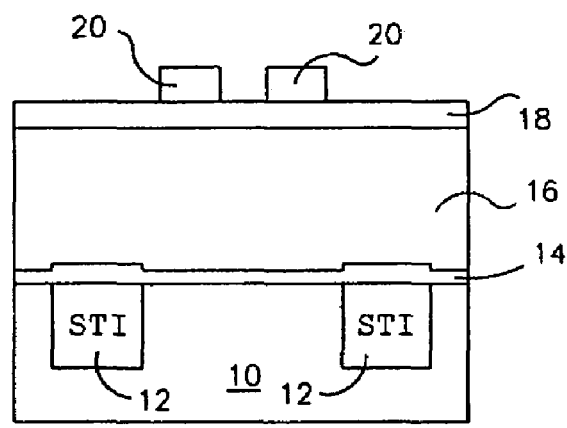
Figure 3:
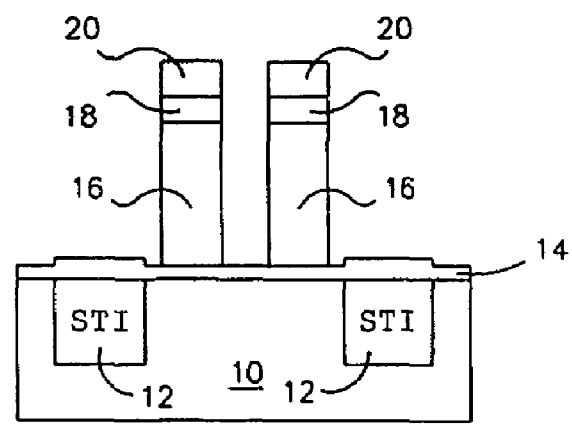

Referring to FIG. 2, a tunnel oxide layer 14 is formed over the substrate 10 using any known process such as thermal oxidation. A first polysilicon layer 16 and a nitride layer 18 are sequentially deposited over the tunnel oxide layer 14. A photoresist layer 20 is then provided over the nitride layer 18. The photoresist layer 20 is patterned and defined to form a plurality of patterned and defined photoresist structures 20. Referring to FIG. 3, with the photoresist structures 20 acting as a mask, the semiconductor device (not numbered) shown in FIG. 2 is etched, for example, with a plasma-based dry etching process. Portions of the nitride layer 18 and first polysilicon layer 16 not masked by the photoresist structures 20 are etched away, exposing portions of the tunnel oxide layer 14. The photoresist structures 20 are then removed.

Figure 4:
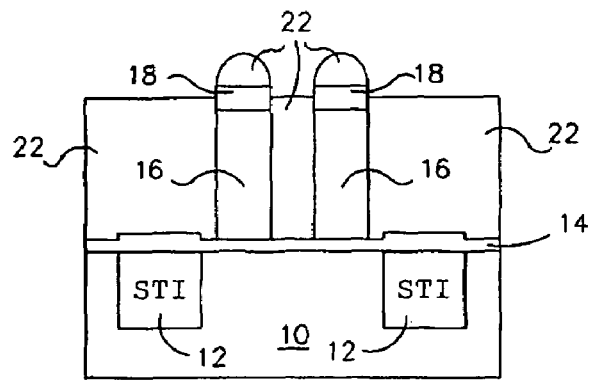
Figure 5:
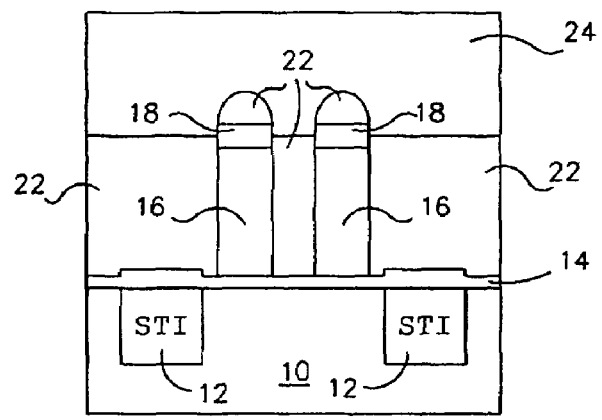

Referring to FIG. 4, a second oxide layer 22 is formed over the exposed portions of the tunnel oxide layer 14 and remaining portions of the nitride layer 18. The thickness of the second oxide layer 22 formed over the tunnel oxide layer 14 may be precisely controlled. The second oxide layer 22 may be formed with a high-density plasma ("HDP") deposition process. As shown in FIG. 5, a sacrificial layer 24 is then formed over the second oxide layer 22. The sacrificial layer 24 may be conformally deposited or spin coated as a low viscosity fluid and baked until solid. The sacrificial layer 24 is generally a photoresist material, but other suitable materials may also be used.

Figure 6:
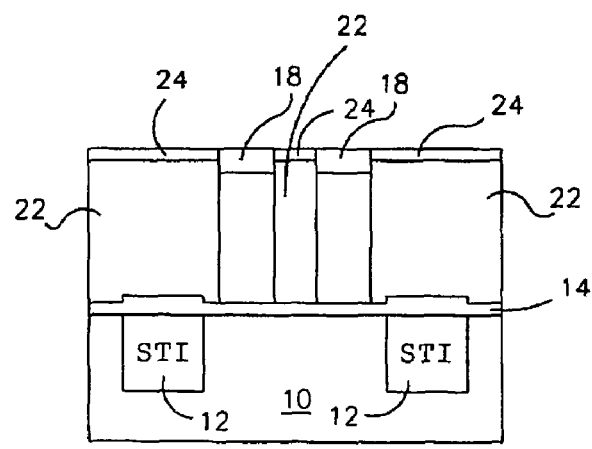

Referring to FIG. 6, an etchback process is used to remove a portion of the sacrificial layer 24, portions of the second oxide layer 22 formed over the nitride layer 18, and portions of the nitride layer 18. The etchback process uses plasma such as $O_2$, $CF_4/O_2$, $CHF_3/O_2$, or $C_2F_6/O_2$, to etch the sacrificial layer 24, portions of the second oxide layer 22 formed over the nitride layer 18, and portions of the nitride layer 18. The etchback process may be performed simultaneously with one or more other etchback processes to reduce the number of processing steps.

Figure 7:
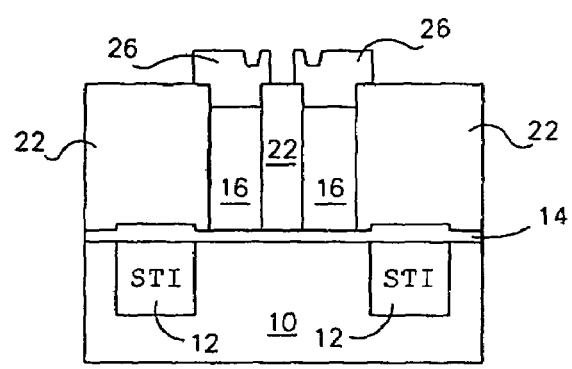

Referring to FIG. 7, the remaining nitride layer 18 and sacrificial layer 24 are removed, exposing the patterned and defined first polysilicon layer 16. A second polysilicon layer 26 is deposited over the first polysilicon layer 16 and second oxide layer 22. A photoresist layer (not shown) is then deposited over the second polysilicon layer 26. The photoresist layer is patterned and defined, followed by etching the second polysilicon layer 26 to form desired second polysilicon portions 26. The photoresist is then removed.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of fabricating a semiconductor device, comprising:
    providing a semiconductor substrate;
    forming a plurality of shallow trench isolation structures in the semiconductor substrate;
    forming a first oxide layer over the semiconductor substrate and the plurality of shallow trench isolation structures;
    depositing a first polysilicon layer over the first oxide layer;
    depositing a nitride layer over the first polysilicon layer;
    masking at least two portions of the nitride layer between two of the plurality of shallow trench isolation structures;
    etching unmasked portions of the nitride layer and portions of the first polysilicon layer underneath the exposed portions of the nitride layer to expose at least a portion of the first oxide layer;
    forming a second oxide layer of a specified thickness over the exposed portion of the first oxide layer;
    providing a sacrificial layer over the second oxide layer;
    etching to remove a portion of the sacrificial layer and a portion of the nitride layer; and
    removing the residual sacrificial layer and the residual nitride layer to expose at least two separate portions of the first polysilicon layer.

2. The method as claimed in claim 1, wherein the sacrificial layer comprises a photoresist.

3. The method as claimed in claim 1, wherein the sacrificial layer comprises a basked solid low viscosity fluid.

4. The method as claimed in claim 1, wherein the second oxide layer is formed using a high-density plasma deposition process.

5. The method as claimed in claim 1, wherein the etching step is performed simultaneously with one or more other etching processes.

6. The method as claimed in claim 1, wherein the etching step comprises a step of plasma etch.

7. The method as claimed in claim 1, further comprising a step of forming and patterning a second polysilicon layer over the at least two separate portions of the first polysilicon layer to form a capacitor.

8. A method for fabricating a capacitor in a semiconductor device, comprising:
    providing a semiconductor substrate;
    forming at least one shallow trench isolation structure in the semiconductor substrate;
    forming a tunnel oxide layer over the semiconductor substrate;
    depositing a first polysilicon layer over the tunnel oxide layer;
    depositing a nitride layer over the first polysilicon layer;
    depositing a first photoresist over the nitride layer;
    patterning and defining the first photoresist layer to expose at least a portion of the nitride layer;
    etching the exposed portion of the nitride layer and the first polysilicon layer underneath the exposed portion of the nitride layer to expose at least a portion of the tunnel oxide layer;
    removing the patterned and defined photoresist layer;
    forming a second oxide layer over at least the exposed portion of the tunnel oxide layer;
    providing a second photoresist layer over the second oxide layer;
    providing an etchback process to remove a portion of the second photoresist layer and a potion of the nitride layer;
    removing the residual second photoresist layer and the residual nitride layer to expose at least a portion of the first polysilicon layer; and
    forming and patterning a second polysilicon layer over at least the exposed portion of the first polysilicon layer.

9. The method as claimed in claim 8, wherein the second oxide layer is formed using a high-density plasma deposition process.

10. The method as claimed in claim 8, wherein the etchback process is performed simultaneously with one or more other etchback processes.

11. The method as claimed in claim 8, wherein the etchback process comprises a step of plasma etch.

* * * * *